(12) United States Patent
Furukawa (10) Patent No.: US 6,957,377 B2
(45) Date of Patent: Oct. 18, 2005

(54) MARKING OF AND SEARCHING FOR INITIAL DEFECTIVE BLOCKS IN SEMICONDUCTOR MEMORY

(75) Inventor: Hideyuki Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 448 days.

(21) Appl. No.: 09/911,375

(22) Filed: Jul. 25, 2001

(65) Prior Publication Data

US 2002/0099995 A1 Jul. 25, 2002

(30) Foreign Application Priority Data

Jan. 25, 2001 (JP) .............................. 2001-017603

(51) Int. Cl.[7] .................... G11C 29/00; G11B 20/20; G06F 11/00
(52) U.S. Cl. .................. 714/763; 714/48; 714/700; 714/704; 714/25
(58) Field of Search .............................. 714/763, 752, 714/765, 25, 48, 700, 704, 799

(56) References Cited

U.S. PATENT DOCUMENTS

| | | | | |
|---|---|---|---|---|
| 5,157,670 A | * | 10/1992 | Kowal | 714/769 |
| 5,956,473 A | * | 9/1999 | Ma et al. | 714/5 |
| 6,058,047 A | * | 5/2000 | Kikuchi | 365/185.33 |
| 6,101,614 A | * | 8/2000 | Gonzales et al. | 714/6 |
| 6,397,357 B1 | * | 5/2002 | Cooper | 714/703 |
| 6,412,089 B1 | * | 6/2002 | Lenny et al. | 714/769 |
| 6,526,537 B2 | * | 2/2003 | Kishino | 714/763 |

* cited by examiner

Primary Examiner—Albert Decady
Assistant Examiner—Esaw Abraham
(74) Attorney, Agent, or Firm—Arent Fox PLLC (57) ABSTRACT

A method of marking an initial defective block in a semiconductor memory device having a memory area thereof divided into a plurality of blocks and provided with an ECC function includes the steps of detecting an initial defective block; and writing an ECC code causing an ECC error in a predetermined area of the initial defective block.

5 Claims, 7 Drawing Sheets

| | STATUS | DESCRIPTION |
|---|---|---|
| I/O0 | PROGRAM/ERASE | 0=SUCCESS, 1=FAILURE |
| I/O1 | ECC ERROR DETECTION | 0=NO ERROR, 1=ERROR DETECTED |
| I/O2 | ECC ERROR CORRECTION | 0=NO DATA CORRECTION, 1=DATA CORRECTED |
| I/O3 | ECC ERROR CORRECTION | RESERVED |
| I/O4 | ECC ERROR CORRECTION | RESERVED |
| I/O5 | ECC ERROR CORRECTION | RESERVED |
| I/O6 | READY/BUSY | 0=BUSY, 1=READY |
| I/O7 | WRITE PROTECTION | 0=PROTECTED, 1=NOT PROTECTED |

FIG. 7

MARKING OF AND SEARCHING FOR INITIAL DEFECTIVE BLOCKS IN SEMICONDUCTOR MEMORY

BACKGROUND OF THE INVENTION

1. Field of the Invention

The present invention generally relates to semiconductor memory devices, and particularly relates to a semiconductor memory device that has a defective block.

2. Description of the Related Art

NAND-type flash memories and AND-type flash memories are allowed to have an initial defect block including defective bits, being different from NOR-type flash memories. In order to notify users of addresses of initial defective blocks, the manufactures write data "00h" in the entirety of a predetermined area of each initial defective block. This predetermined area in any non-defective block has the entirety thereof in an erased state, and has "FFh" stored therein. Users read data from the predetermined area, and check whether the retrieved data are all "FFh". If any one piece of the data read from the predetermined area is not "FFh", then, the block is ascertained as a defective block.

Blocks ascertained as being defective are controlled in a list format by a control-end device such as a memory controller, a CPU, or the like by using a list that indicates defective blocks. In detail, a check is made in an apparatus using a flash memory as to whether all the bytes are "FFh" by reading data from all the predetermined areas of all the blocks. When a defective block is detected, data of a defective block address is stored in the flash memory itself or another memory device by using a predetermined table format or the like. When the flash memory itself is used during normal operations, the address information indicative of defective blocks is referred to, and control is attended to so as not to access the defective blocks.

In the configuration in which defective blocks are controlled as described above, data that are in existence at the time of shipping out from factories will be lost once the memory is used. When there is a need to use a memory in a system after having used the memory in another system, there is no way of knowing the positions of defective blocks by inspecting the data of the memory.

In NAND-type flash memories and AND-type flash memories, there is a possibility of a new defect developing after shipping out from factories. If an ECC error is detected when reading data from a block that is supposed to be non-defective, this block is registered as a subsequently acquired defect block, and no access thereto will be made thereafter. In this manner, there are initial defective blocks and subsequently acquired defective blocks, and different detection processes need to be carried out for the respective types of blocks. This makes the control of defective blocks prohibitively complicated.

Accordingly, there is a need for a semiconductor memory device and a defective block control method that provide easy control of defective blocks.

SUMMARY OF THE INVENTION

It is a general object of the present invention to provide a method and a device that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method and a device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of marking an initial defective block in a semiconductor memory device at the time of shipping out where the semiconductor memory device has a memory area thereof divided into a plurality of blocks, and is provided with an ECC function. The method includes the steps of detecting an initial defective block, and writing an ECC code causing an ECC error in a predetermined area of the initial defective block.

Further, the present invention provides a method of searching for an initial defective block existing at the time of shipping out in a semiconductor memory device having a memory area thereof divided into a plurality of blocks and provided with an ECC function. The method includes the steps of reading data from a predetermined area of a given block, performing an ECC check on the read data, and identifying the given block as a defective block if an ECC error is detected.

Initial defective blocks are controlled in this manner, so that even after using the memory device and eliminating data as it was in existence at the time of shipping out, a data read operation for any given block causes an ECC error to be generated if it is a defective block, and causes no ECC error if it is not a defective block. Accordingly, inspection of data of the memory device makes it possible to identify the positions of defective blocks inclusive of initial defective blocks when the memory device is to be used in a system after using it in another system.

If an additional defect is generated after shipping out, i.e., if an ECC error is detected while reading data from a block in use, this block is registered as a defective block that has the recorded ECC code thereof failing to match an ECC code of the retrieved data. In this manner, an initial defective block and a subsequently acquired defective block end up having identical conditions, which makes it easier to control defective blocks.

Moreover, if the semiconductor memory device is configured such that information about presence/absence of an ECC error is output to an exterior of the semiconductor memory device, all that is necessary for detecting an initial defective block is to check the information about presence or absence of an ECC error. There is thus no need to inspect all the data of the predetermined area as was necessary in the related art. Accordingly, the process of searching for initial defective blocks can be performed at high speed.

Further, according to the present invention, a semiconductor memory device includes a memory area divided into a plurality of blocks, an ECC generation circuit that generates an ECC code for data written in and data read from an accessed block, and an ECC suspension circuit that suspends an ECC generation function of the ECC generation circuit so as to allow an ECC code to be directly written in the memory area from an exterior of the semiconductor memory device.

In the semiconductor memory device as described above, there is a need to write an ECC code causing an ECC error in the predetermined area of a defective block if a check at the time of shipping out finds the defective block. If the ECC generation circuit is operating as expected, however, an ECC code indicative of an ECC error cannot be written. The present invention thus activates the ECC suspension circuit so as to suspend operations of the ECC generation circuit, thereby allowing an ECC code indicative of an ECC error to be directly written from the exterior of the semiconductor memory device.

DESCRIPTION OF THE PREFERRED EMBODIMENTS

In the following, embodiments of the present invention will be described with reference to the accompanying drawings.

Figure 1:
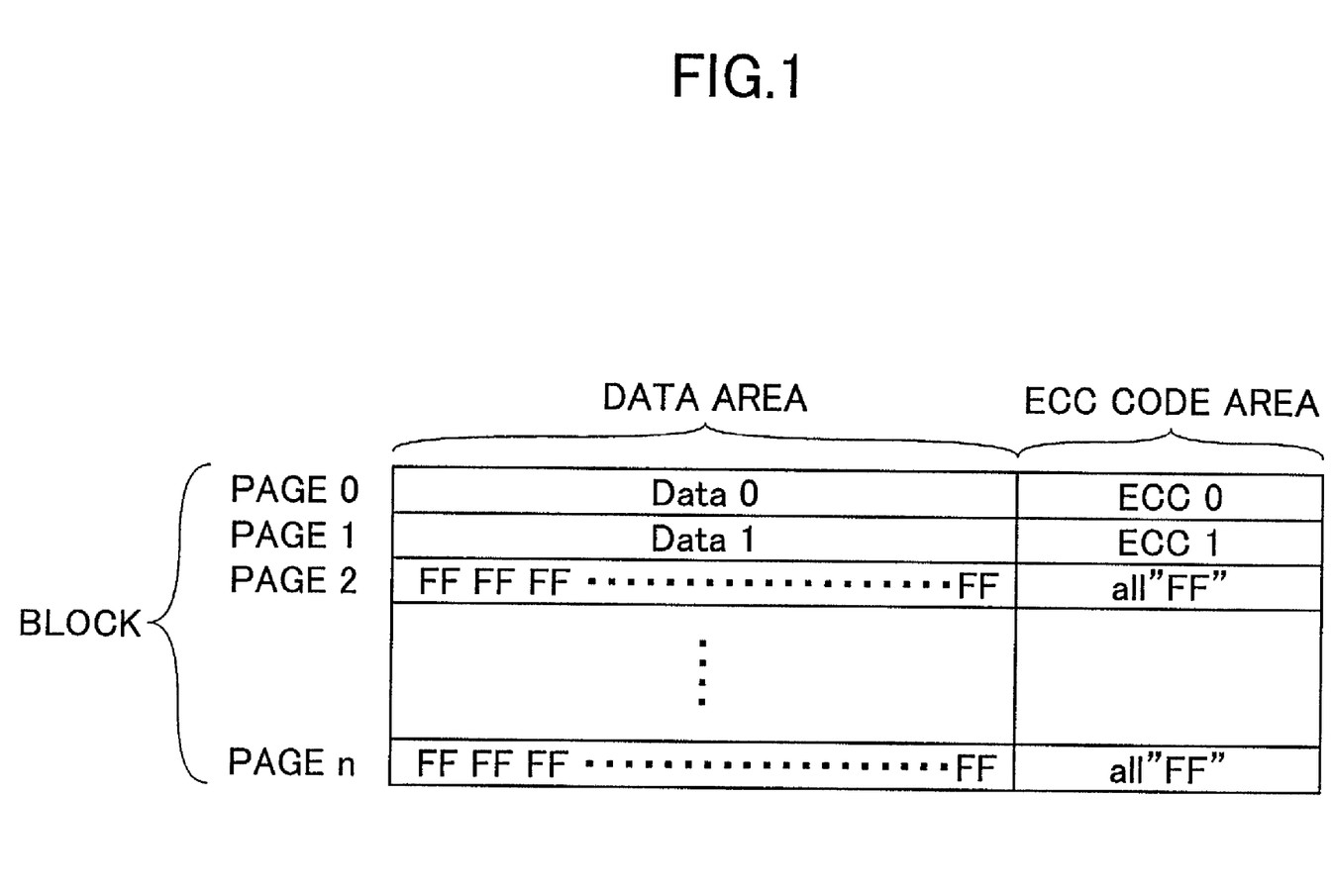
FIG. 1 is a drawing showing a data structure of an initial defective block according to the present invention.

FIG. 1 is a drawing showing a data structure of an initial defective block according to the present invention.

In the present invention, it is assumed that a memory device is equipped with an ECC function. In this type of memory device, an initial defect block is defined as a block in which a predetermined area includes an area that causes a data read ECC error. Namely, the predetermined area of a block ascertained as being an initial defective block has data recorded therein at the time of shipping out so that the data causes an ECC error.

In FIG. 1, one block includes n pages from page 0 to page n-1. Each page is divided into a data area and an ECC code area. The predetermined area that is used for indicating an initial defective block may be page 0 and page 1, for example. If the block shown in FIG. 1 is a defective block, an ECC code ECC0 is set such that an ECC code of data Data0 read from page 0 differs from the ECC code ECC0 of the ECC code area. Further, an ECC code ECC1 is set such that an ECC code of data Data1 read from page 1 differs from the ECC code ECC1 of the ECC code area. Although it is preferable to set ECC codes that cause errors in both page 0 and page 1, setting an ECC code that causes an error in only one of them is also acceptable.

When there is a need to check whether a given block is defective, data is read from page 0 and page 1 that constitute the predetermined area, and a check is made as to whether an ECC error is generated. If an ECC error is generated with respect to at least either one of page 0 and page 1, this block is ascertained as being defective.

Initial defective blocks are controlled in this manner, so that even after using a memory device and eliminating data as it was in existence at the time of shipping out, data read operation for any given block causes an ECC error to be generated if it is a defective block, and causes no ECC error if it is not a defective block. Accordingly, inspection of data of the memory device makes it possible to identify the positions of defective blocks when the memory device is to be used in a system after using it in another system.

If an additional defect is generated after shipping out, i.e., if an ECC error is detected while reading data from a block in use, this block is registered as a defective block that has the recorded ECC code thereof failing to match an ECC code of the retrieved data. In this manner, an initial defective block and a subsequently developed defective block end up having identical conditions, which makes it easier to control defective blocks.

Figure 2:
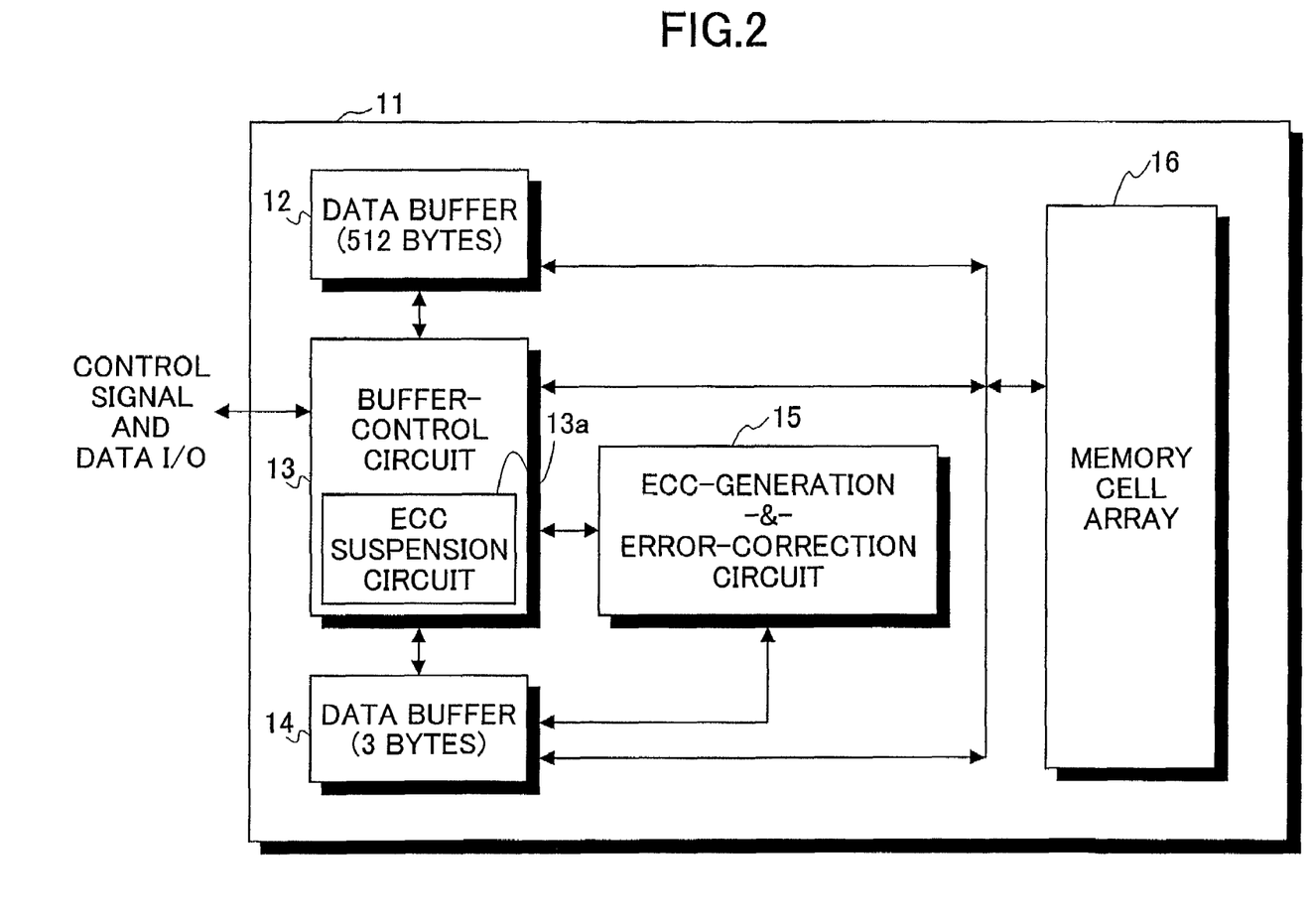
FIG. 2 is a block diagram showing a configuration of a semiconductor memory device according to the present invention.

FIG. 2 is a block diagram showing a configuration of a semiconductor memory device according to the present invention.

A semiconductor memory device 11 of FIG. 2 is a NAND-type or AND-type flash memory equipped with an ECC function, and includes a data buffer 12, a buffer-control circuit 13, a data buffer 14, an ECC-generation-&-error-correction circuit 15, and a memory cell array 16.

The buffer-control circuit 13 receives control signals, data signals, address signals, and the like from the exterior of the device, and outputs data signals and the like to the exterior of the device. The buffer-control circuit 13 controls buffering relating to data input/output operations, and attends to control of ECC-related processing.

During normal operations, the ECC function is used. At the time of a data write operation, the buffer-control circuit 13 receives data, and supplies the data to the ECC-generation-&-error-correction circuit 15, thereby having an ECC code calculated from the input data. The computed ECC code is supplied to the data buffer 14 so as to be buffered. The input data is also supplied from the buffer-control circuit 13 to the data buffer 12 so as to be buffered. The data stored in the data buffer 12 and the ECC code stored in the data buffer 14 are supplied to the memory cell array 16, and are stored at an indicated address. As shown in FIG. 1, data is stored in the data area, and the ECC code is stored in the ECC-code area.

In the case of data read operations, data is read from an indicated address in the memory cell array 16, and is supplied to the data buffer 12 so as to be buffered. An ECC code of the retrieved data is read from the memory cell array 16, and is supplied to the data buffer 14 so as to be buffered. The buffer-control circuit 13 provides the data read from the memory cell array 16 to the ECC-generation-&-error-correction circuit 15, thereby having an ECC code computed from the data. The ECC-generation-&-error-correction circuit 15 receives the ECC code of the retrieved data from the data buffer 14, and compares the computed ECC code with the retrieved ECC code. An ECC error is detected if they do not match.

If the ECC error includes only one bit error, the ECC-generation-&-error-correction circuit 15 corrects the error, and supplies the corrected data to the exterior of the device. When no error is detected, the data buffered by the data buffer 12 is supplied to the exterior of the memory device 11 via the buffer-control circuit 13.

During a data read operation, a signal indicative of the presence or absence of an ECC error is supplied to the exterior of the device by the buffer-control circuit 13. Alternatively, a status read command or the like may be entered in the buffer-control circuit 13 from the exterior of the device, and, in response, an indication of presence/absence of an ECC error may be reported to the exterior of the device. Further, information about the applicability of error correction may be provided to the exterior.

The buffer-control circuit 13 includes an ECC suspension circuit 13a. The ECC suspension circuit 13a operates in response to control signals or commands input from the exterior, and serves to suspend the operation of the ECC-generation-&-error-correction circuit 15. The ECC suspension circuit 13a is provided for the purpose of writing a ECC code in the memory cell array 16 directly from the exterior of the device without having an intervening process of the ECC-generation-&-error-correction circuit 15 where the ECC code is intended to cause an ECC error in the predetermined area of a detected defective block. Namely, when a defective block is detected at the time of inspection prior to shipping out from the factory, an ECC code that causes an ECC error needs to be recorded in the ECC code area of pages 0 and 1 of the defective block. If the ECC-generation-&-error-correction circuit 15 is in operation as it is supposed to do during normal operations, the ECC code that causes an ECC error cannot be recorded. In consideration of this, a control signal or a command is input from the exterior to activate the ECC suspension circuit 13a, thereby suspending the operation of the ECC-generation-&-error-correction circuit 15. This makes it possible to write an ECC code that causes an ECC error directly from the exterior.

Figure 3:
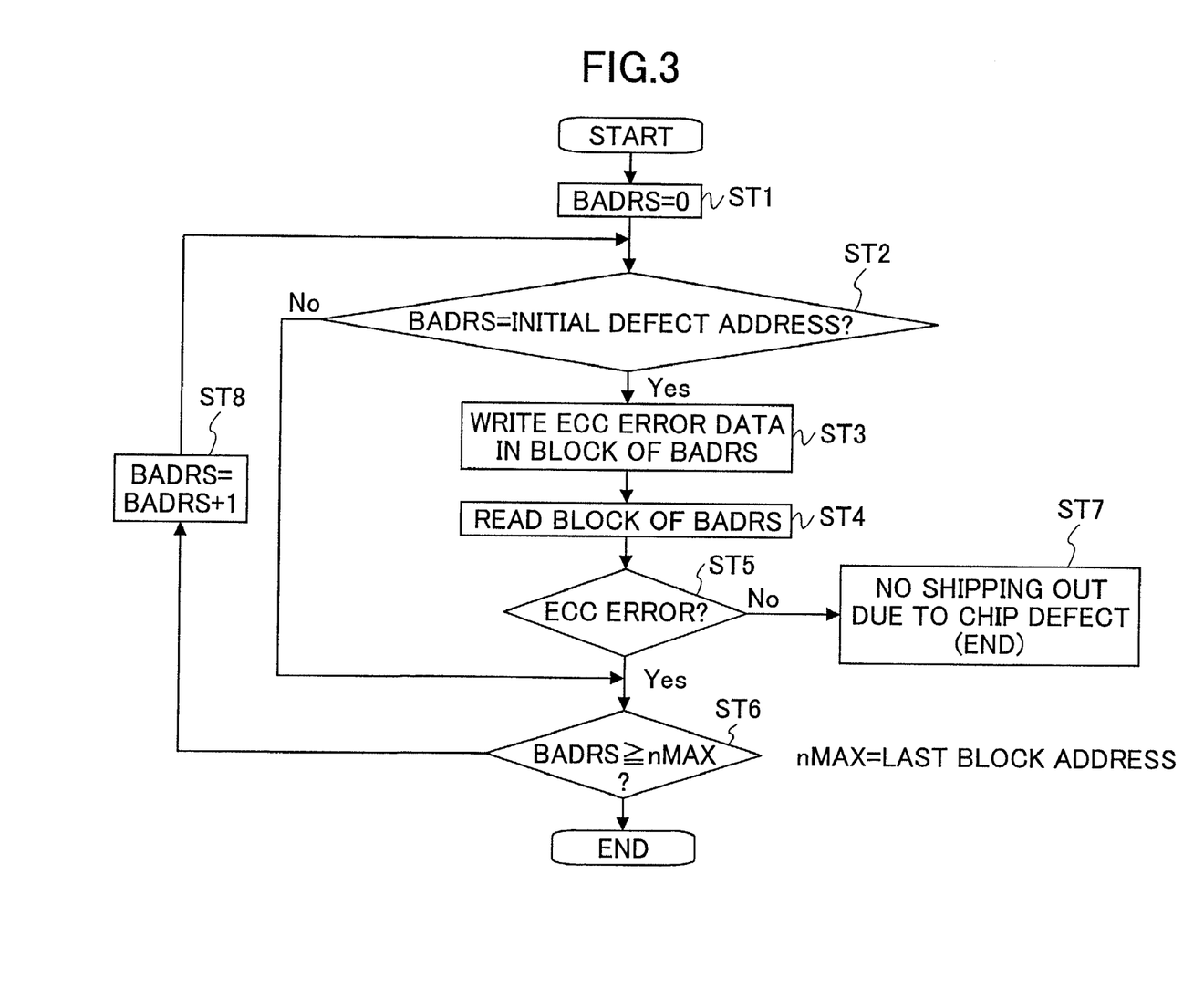
FIG. 3 is a flowchart of a marking process for an initial defective block according to the present invention.

FIG. 3 is a flowchart of a marking process for an initial defective block according to the present invention. This process is performed by the manufacturer at the time of shipping out of memory chips.

At step ST1, a block address BADRS is initialized to zero.

At step ST2, a check is made as to whether the block address BADRS is a block address of an initial defective block. If it is a block address of an initial defective block, the procedure goes to step ST3. If the block address BADRS is not a block address of an initial defective block, the procedure goes to step ST6.

At step ST3, a code that causes an ECC error is recorded in the predetermined area of a block of the block address BADRS. In the example of the semiconductor memory device of FIG. 2, the ECC suspension circuit 13a is activated to suspend the ECC-generation-&-error-correction circuit 15, and an ECC code indicative of an ECC error is written from the exterior of the device.

At step ST4, data is read from the predetermined area of the block address BADRS.

At step ST5, a check is made as to whether an ECC error is detected. If no ECC error is detected, it is ascertained that the memory chip is of itself defective because it does not operate as expected despite the fact that the code causing an ECC error was recorded. In this case, therefore, it is decided at step ST7 that the memory chip cannot be shipped out. If the ECC error is detected, the procedure goes to step ST6.

At the step ST6, a check is made as to whether the block address BADRS is a last block address nMAX. If it is not the last block, the procedure goes to step ST8, at which the block address BADRS is incremented by one, followed by returning to the step ST2 and repeating the subsequent steps. If the block address BADRS is the last block address, the procedure comes to an end.

Through the processing as described above, a code that causes an ECC error is recorded in the predetermined area of each initial defective block, thereby marking each initial defective block of a memory.

Figure 4:
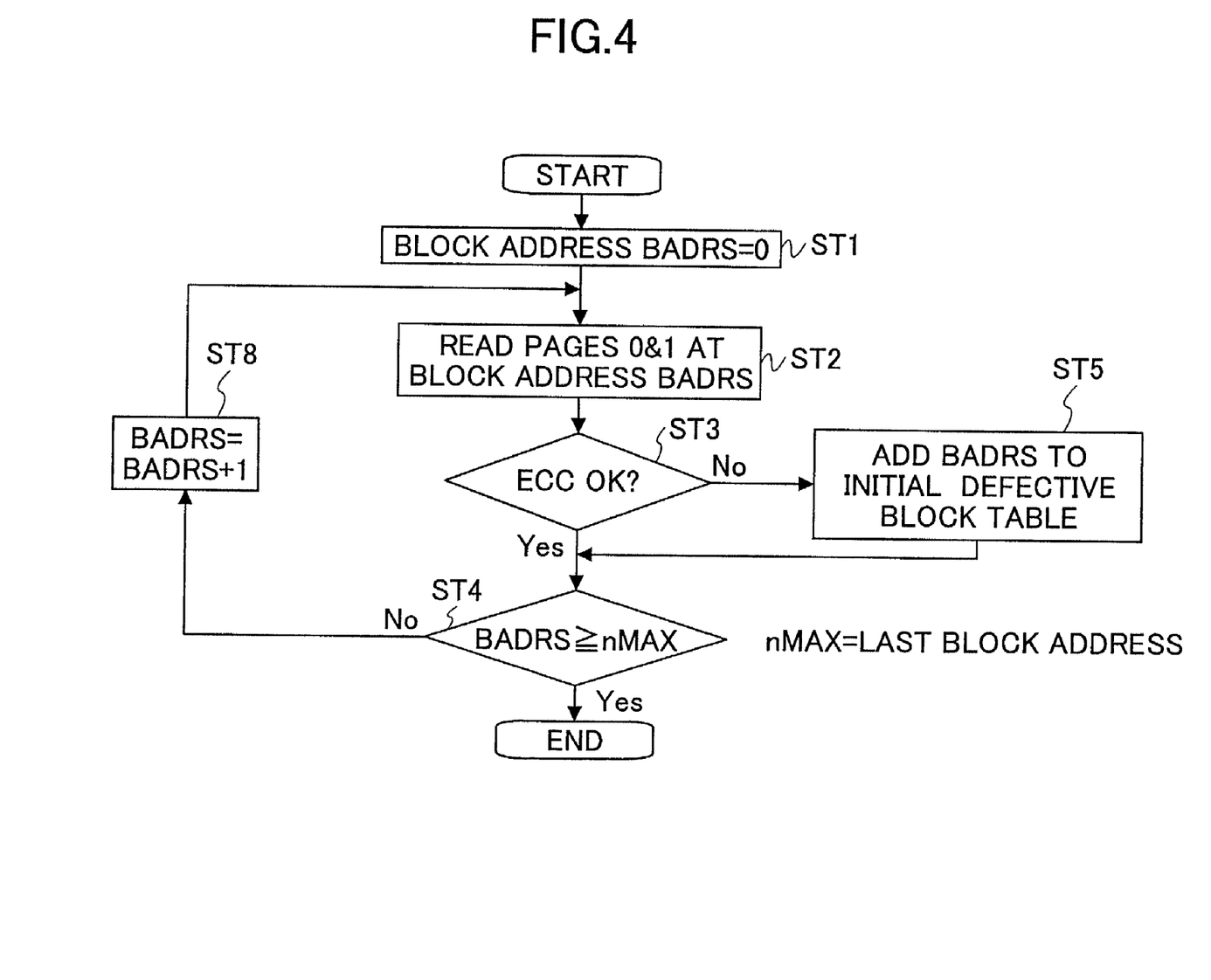
FIG. 4 is a flowchart showing a process of searching for an initial defective block according to the present invention.

FIG. 4 is a flowchart showing a process of searching for an initial defective block according to the present invention. This process is performed by users in order to control initial defective blocks in a table format or the like.

At step ST1, a block address BADRS is initialized to zero.

At step ST2, data is read from the predetermined area (e.g., pages 0 and 1) of a block at the block address BADRS.

At step ST3, a check is made as to whether the ECC check of the retrieved data indicates no error. If there is an error, the procedure goes to step ST5, at which the block address BADRS is added to the table used for controlling initial defective blocks. If there is no error, the procedure goes to step ST4.

At the step ST4, a check is made as to whether the block address BADRS is a last block address nMAX. If it is not the last block, the procedure goes to step ST6, at which the block address BADRS is incremented by one, followed by returning to the step ST2 and repeating the subsequent steps. If the block address BADRS is the last block address, the procedure comes to an end.

Through the processing as described above, initial defective blocks are searched for at the user end, and can be registered in the table for controlling initial defective blocks.

Figure 5:
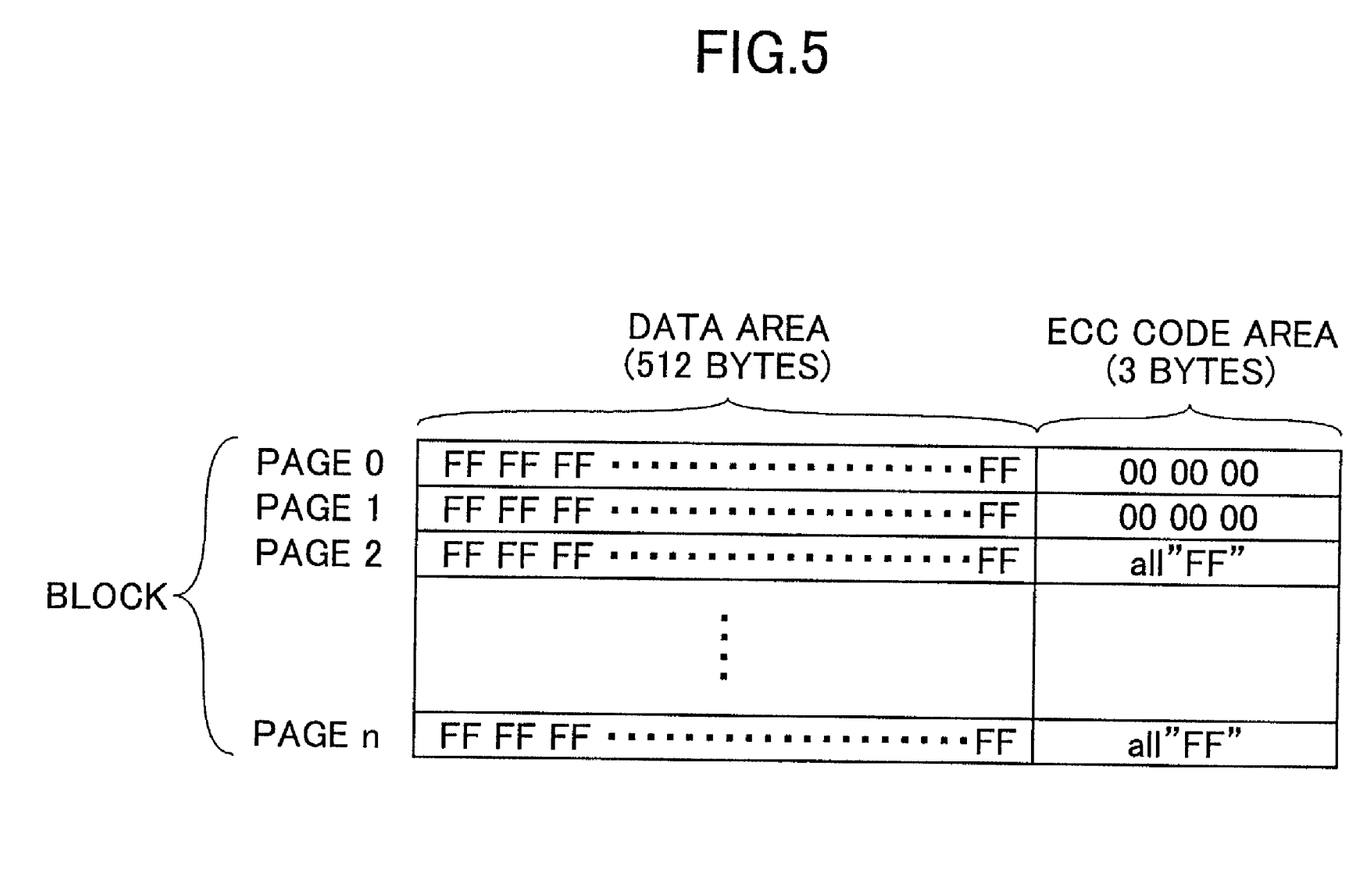
FIG. 5 is an illustrative drawing showing an example of an initial defective block.

FIG. 5 is an illustrative drawing showing an example of an initial defective block.

On block includes n pages, i.e., from page 0 to page n-1. Each page is divided into a data area of 512 bytes and an ECC code area of 3 bytes. The predetermined area used as an indication of an initial defective block may be comprised of page 0 and page 1. All the data area is in the erased condition at the initial stage, having the data "FFh" recorded in each byte. ECC code areas of other pages in addition to pages 0 and 1 serving as the predetermined area are in the erased condition at the initial stage. A correct ECC code for the data having "FFh" in each byte thereof has "FFh" in each byte thereof. Accordingly, the data and the ECC codes match in pages other than the predetermined area.

In the ECC code areas of pages 0 and 1 serving as the predetermined area, each byte has "00 h" recorded therein. In the example of semiconductor memory device of FIG. 2, the ECC suspension circuit 13a is activated to suspend the operation of the ECC-generation-&-error-correction circuit 15, and an ECC code "00 h" indicative of an ECC error is written from the exterior of the device.

In this manner, ECC codes that cause ECC errors are written in the predetermined areas of initial defective blocks, which provides a basis for identifying defective blocks easily even after the systems are switched.

Figure 6:
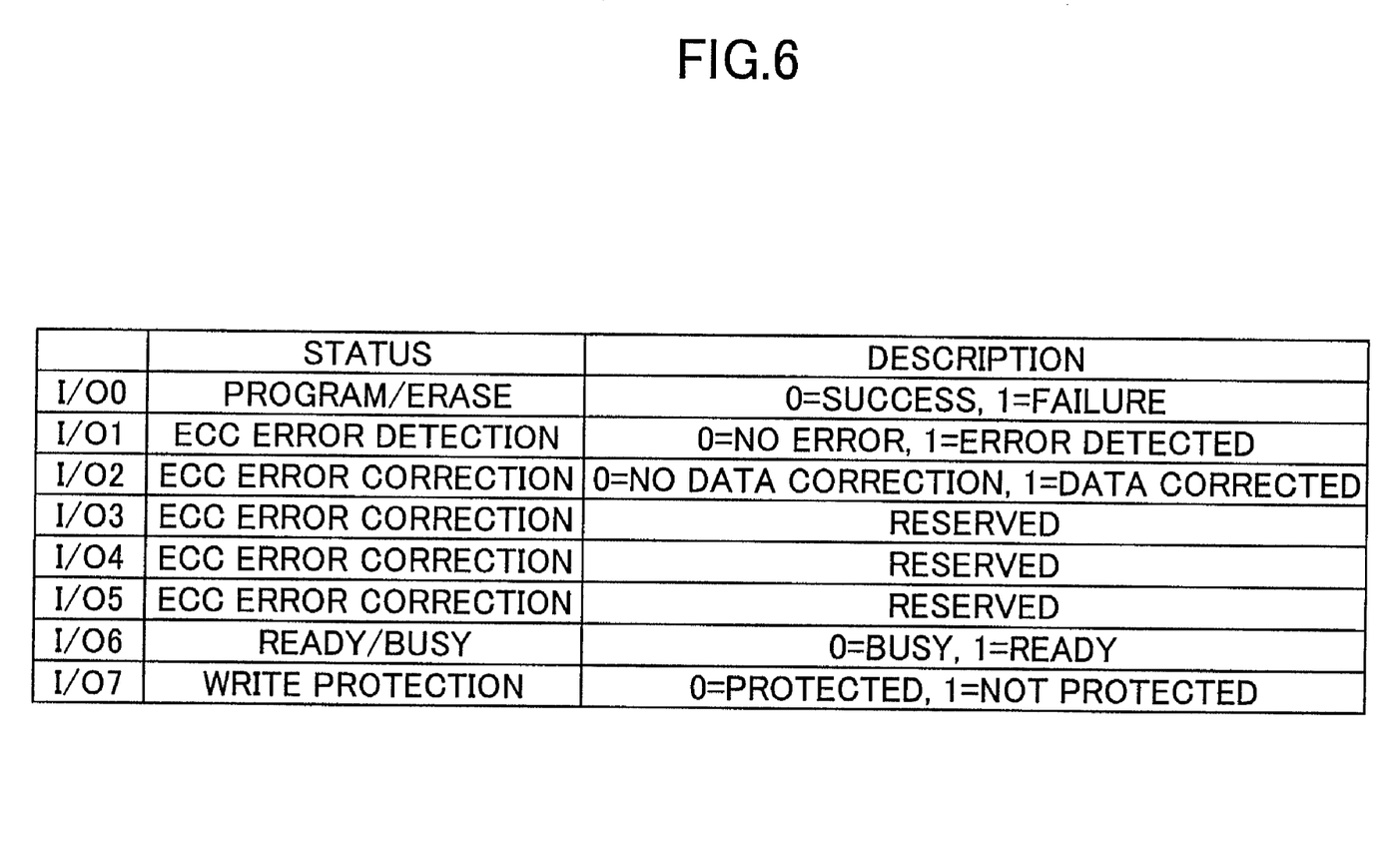
FIG. 6 is an illustrative drawing for explaining ECC error detection at the time of data reading.

FIG. 6 is an illustrative drawing for explaining ECC error detection at the time of data reading.

FIG. 6 shows an example of data that is output from I/O pins by the buffer-control circuit 13 in response to a status read command entered in the semiconductor memory device of FIG. 2 after a data read operation. As shown in FIG. 6, each I/O pin has specific meaning assigned thereto, and a first I/O pin I/O1 indicates an ECC error status in this example. Namely, a status of whether an ECC error is generated can be easily checked by entering a status read command in the semiconductor memory device after a data read operation and by reading information indicative of presence/absence of an ECC error that is output from the pin I/O1.

In this manner, all that is necessary for detecting a defective block is to input a status read command and to check a signal level appearing at the pin I/O1. There is thus no need to inspect all 1024 bytes of the two pages of the predetermined area whereas that was necessary in the related art. Accordingly, the process of searching for initial defective blocks can be performed at high speed.

A pin I/O2 outputs information indicative of whether error correction is carried out. Based on this information, a check may be made as to whether the ECC error is a correctable error, and the control of defective blocks may be attended to only in respect of ECC errors that are correctable.

Figure 7:
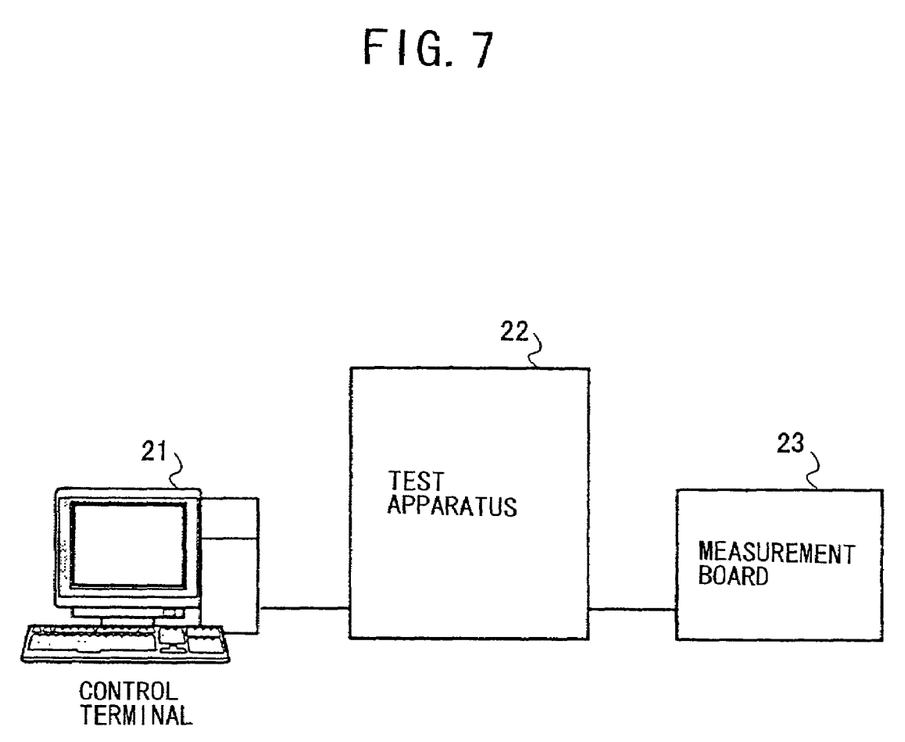
FIG. 7 is a drawing of a tester system that is used when marking initial defective blocks by testing a semiconductor memory device.

FIG. 7 is a drawing of a tester system that is used when marking initial defective blocks by testing a semiconductor memory device.

The tester system includes a control terminal 21, a test apparatus 22, and a measurement board 23. The measurement board 23 is provided with a plurality of terminals for connection with the memory, and a memory to be tested is mounted thereon. The control terminal 21, which is a computer, operates based on programs to control the test apparatus 22, thereby supplying signals to the memory via the memory connection terminals of the measurement board 23 and checking signals output from the memory. In this manner, a test of the memory is conducted as shown in FIG. 2, for example, and the process of FIG. 3 is performed to mark initial defective blocks.

In the ECC (error check and correction), a predetermined ECC code generation method is used to generate an ECC code at the time of data writing so as to record the ECC code in an area set aside in advance. At the time of data reading, the predetermined ECC code generation method generates an ECC code from the retrieved data, and, then, the generated ECC code is compared with the recorded ECC code so as to detect or correct an error. An ECC code generation method is well within the scope of ordinary skill in the art, and a detailed description thereof will be omitted.

The error check of the present invention is not limited to a particular method, and can be any method that can be used to record an error check code in an error code area as described above. Further, a method of generating a code is not limited to a particular code generation method. Namely, the present invention is not limited to a particular error check method, and can employ any error check method such as a CRC check that is available within the scope of the existing art. If a new error-check method is available in the future, such a method may be applicable to the present invention. Replacement with equivalents that are obvious to a person having ordinary skill in the art is intended to be within the scope of the present invention.

Further, the present invention is not limited to these embodiments, but various variations and modifications may be made without departing from the scope of the present invention.

The present application is based on Japanese priority application No. 2001-017603 filed on Jan. 25, 2001, with the Japanese Patent Office, the entire contents of which are hereby incorporated by reference.

What is claimed is:

1. A method of marking an initial defective block in a semiconductor memory device having a memory area thereof divided into a plurality of blocks and provided with an ECC function, comprising the steps of:

detecting an initial defective block; and writing an ECC code causing an ECC error in a predetermined area of the initial defective block, wherein said step of writing an ECC code includes the steps of:

suspending an ECC generation function internal to said semiconductor memory device; and writing the ECC code from an exterior of said semiconductor memory device.

2. A method of marking an initial defective block in a semiconductor memory device having a memory area thereof divided into a plurality of blocks and provided with an ECC function, comprising the steps of:

detecting an initial defective block; and writing an ECC code causing an ECC error in a predetermined area of the initial defective block, reading data from the initial defective block after said step of writing an ECC code;

performing an ECC check on the read data; and rejecting said semiconductor memory device as being defective if an ECC error is not detected.

3. A semiconductor memory device, comprising:

a memory area divided into a plurality of blocks;

an ECC generation circuit that generates an ECC code for data written into and for data read from an accessed block; and an ECC suspension circuit that suspends an ECC generation function of said ECC generation circuit so as to allow the ECC code to be directly written into said memory area from an exterior of the semiconductor memory device, wherein information about presence or absence of an ECC error is output to the exterior of the semiconductor memory device in response to a predetermined command input after a data read operation.

4. The semiconductor memory device as claimed in claim 3, wherein information about whether ECC correction is possible is output to the exterior of said semiconductor memory device.

5. The semiconductor memory device as claimed in claim 4, wherein the information about whether ECC correction is possible is output to the exterior of said semiconductor memory device in response to a predetermined command input after a data read operation.

* * * * *